US007447919B2

(12) United States Patent  
Liepe et al.

(10) Patent No.: US 7,447,919 B2
(45) Date of Patent: Nov. 4, 2008

(54) VOLTAGE MODULATION FOR INCREASED RELIABILITY IN AN INTEGRATED CIRCUIT

(75) Inventors: Steven F. Liepe, Fort Collins, CO (US); Samuel Naffziger, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1065 days.

(21) Appl. No.: 10/818,974

(22) Filed: Apr. 6, 2004

(65) Prior Publication Data

US 2005/0223251 A1    Oct. 6, 2005

(51) Int. Cl.
*G06F 1/00* (2006.01)
*G06F 11/00* (2006.01)

(52) U.S. Cl. .................. 713/300; 713/600; 714/47; 714/48; 714/731

(58) Field of Classification Search ................. 713/300, 713/600; 714/731, 740, 47, 48
See application file for complete search history.

(56) References Cited

U.S. PATENT DOCUMENTS

| | | | |
|---|---|---|---|
| 5,086,238 A | | 2/1992 | Watanabe et al. |
| 5,303,190 A | * | 4/1994 | Pelley, III ............... 365/189.11 |
| 5,438,543 A | * | 8/1995 | Yoon ...................... 365/189.11 |
| 5,440,520 A | | 8/1995 | Schutz et al. |
| 5,526,313 A | | 6/1996 | Etoh et al. |
| 5,532,962 A | * | 7/1996 | Auclair et al. ............... 365/201 |
| 5,644,546 A | | 7/1997 | Furumochi et al. |
| 5,734,622 A | * | 3/1998 | Furumochi et al. ........ 365/233.5 |
| 6,141,240 A | * | 10/2000 | Madan et al. ................ 365/156 |
| 6,425,086 B1 | | 7/2002 | Clark et al. |
| 6,499,048 B1 | | 12/2002 | Williams |
| 6,509,788 B2 | | 1/2003 | Naffziger et al. |
| 6,640,313 B1 | | 10/2003 | Quach |
| 6,954,916 B2 | * | 10/2005 | Bernstein et al. ............... 716/6 |
| 6,976,181 B2 | * | 12/2005 | Dai et al. ..................... 713/320 |
| 7,017,073 B2 | | 3/2006 | Nair |
| 7,092,281 B1 | * | 8/2006 | Aipperspach et al. ....... 365/154 |
| 7,269,780 B2 | * | 9/2007 | Arima et al. ................. 714/764 |
| 7,329,929 B2 | * | 2/2008 | Kim et al. .................... 257/393 |
| 2001/0034824 A1 | | 10/2001 | Mukherjee |
| 2001/0034854 A1 | | 10/2001 | Mukherjee |
| 2002/0116650 A1 | | 8/2002 | Halepete et al. |
| 2002/0130712 A1 | | 9/2002 | Naffziger et al. |
| 2002/0133745 A1 | | 9/2002 | Okin |
| 2002/0188874 A1 | | 12/2002 | Yu et al. |
| 2002/0194425 A1 | * | 12/2002 | Penchuk ..................... 711/105 |
| 2004/0054936 A1 | | 3/2004 | Dwyer, III et al. |
| 2005/0108509 A1 | | 5/2005 | Safford |
| 2005/0240793 A1 | | 10/2005 | Safford |

OTHER PUBLICATIONS

Matakias et al., A Circuit Detection of Soft and Timing Errors in Digital CMOS Ics, Feb. 14, 2004, Journal of Electronic Testing:Theory and Applications, vol. 20, pp. 523-531.*

* cited by examiner

*Primary Examiner*—Mark Connolly

(57) ABSTRACT

Techniques are disclosed for increasing reliability of an integrated circuit. In one embodiment, an integrated circuit includes core chip circuitry. The integrated circuit includes means for increasing a power supply voltage V provided to the core chip circuitry, such as by increasing the voltage V to a maximum value. The integrated circuit also includes means for identifying a clock frequency F for which $F < P_{max}/(CV^2)$, where C is a switching capacitance and where $P_{max}$ is a predetermined maximum power consumption of the core chip circuitry. The integrated circuit also includes means for providing a clock signal having frequency F to the circuit.

31 Claims, 6 Drawing Sheets

VOLTAGE MODULATION FOR INCREASED RELIABILITY IN AN INTEGRATED CIRCUIT

CROSS REFERENCE TO RELATED APPLICATIONS

This application is related to the following co-pending and commonly-owned patent applications, which are hereby incorporated by reference:

U.S. patent application Ser. No. 09/811,243, filed on Sep. 19, 2003, and entitled "System and Method Utilizing On-Chip Voltage Monitoring to Manage Power Consumption"; and U.S. patent application Ser. No. 10/320,586, filed on Dec. 16, 2003, and entitled "System and Method for Implementing an Integrated Circuit Having a Dynamically Variable Power Limit"; and the following commonly-owned and concurrently-filed patent applications, which are hereby incorporated by reference: "Architectural Support for Selective Use of a High-Reliability Mode in a Computer System", Attorney Docket No. 200309888-1; "Lockstep Error Signaling", Attorney Docket No. 200309967-1; "Core-Level Processor Lockstepping", Attorney Docket No. 200309969-1; "Off-Chip Lockstep Checking", Attorney Docket No. 200309968-1.

BACKGROUND

1. Field of the Invention

The present invention relates to techniques for reducing the frequency of soft errors in an integrated circuit.

2. Related Art

Cosmic rays or alpha particles that strike a silicon-based device, such as a microprocessor, can cause an arbitrary node within the device to change state in unpredictable ways, thereby inducing what is referred to as a "soft error." Microprocessors and other silicon-based devices are becoming increasingly susceptible to soft errors as such devices decrease in size. Soft errors are transient in nature and may or may not cause the device to malfunction if left undetected and/or uncorrected. An uncorrected and undetected soft error may, for example, cause a memory location to contain an incorrect value which may in turn cause the microprocessor to execute an incorrect instruction or to act upon incorrect data.

A single undetected and undetected soft error can cause a computer system to crash or otherwise become unusable until the error is corrected or the system is reset and brought back to a normal operating condition. Such error recovery may require several hours or even several days, depending on the nature of the error and the size and complexity of the computer system. Each hour of downtime may cause the computer system owner or operator to incur costs in the thousands, or even millions, of dollars depending on the size of the enterprise serviced by the computer system. Furthermore, service providers which guarantee minimum levels of service for covered computer systems (such as a guaranteed maximum number of hours to recover from any error) are also put at risk by soft errors which are difficult to detect and correct quickly. There is, therefore, a significant need to prevent the occurrence of soft errors and to detect and correct such errors quickly when they occur.

One response to soft errors has been to add hardware to microprocessors to detect and correct such errors. Various techniques have been employed to perform such detection and correction, such as adding parity-checking capabilities to processor caches. Such techniques, however, are best at detecting and correcting soft errors in memory arrays, and are not as well-suited for detecting and correcting soft errors in arbitrary control logic, execution datapaths, or latches within a microprocessor. In addition, adding circuitry for implementing such techniques can add significantly to the size and cost of manufacturing the microprocessor.

One technique that has been used to protect arbitrary control logic and associated execution datapaths is to execute the same instruction stream on two or more processors in parallel. Such processors are said to execute two copies of the instruction stream "in lockstep," and therefore are referred to as "lockstepped processors." When the microprocessors are operating correctly (i.e., in the absence of soft errors), all of the lockstepped processors should obtain the same results because they are executing the same instruction stream. A soft error introduced in one processor, however, may cause the results produced by that processor to differ from the results produced by the other processor(s). Such systems, therefore, attempt to detect soft errors by comparing the results produced by the lockstepped processors after each instruction or set of instructions is executed in lockstep. If the results produced by any one of the processors differs from the results produced by the other processors, a fault is raised or other corrective action is taken. Because lockstepped processors execute redundant instruction streams, lockstepped systems are said to perform a "functional redundancy check."

One problem with lockstep-based techniques is that they typically incur a performance penalty of at least 50% by requiring all instructions to be executed in duplicate. Systems which employ lockstepping therefore obtain increased reliability at the expense of performance. Furthermore, lockstepped systems can be difficult and costly to implement due to the additional circuitry required.

What is needed, therefore, are improved techniques for reducing the frequency of soft errors in computing systems.

SUMMARY

In one aspect of the present invention, a method is provided which includes steps of: (A) identifying a power supply voltage V provided to an integrated circuit, such as a microprocessor; (B) identifying a clock frequency F for which $F<P_{max}/(CV^2)$, wherein C comprises a switching capacitance and wherein $P_{max}$ comprises a predetermined maximum power consumption of the integrated circuit; and (C) providing a clock signal having frequency F to the integrated circuit.

Other features and advantages of various aspects and embodiments of the present invention will become apparent from the following description and from the claims.

DETAILED DESCRIPTION

Figure 1:
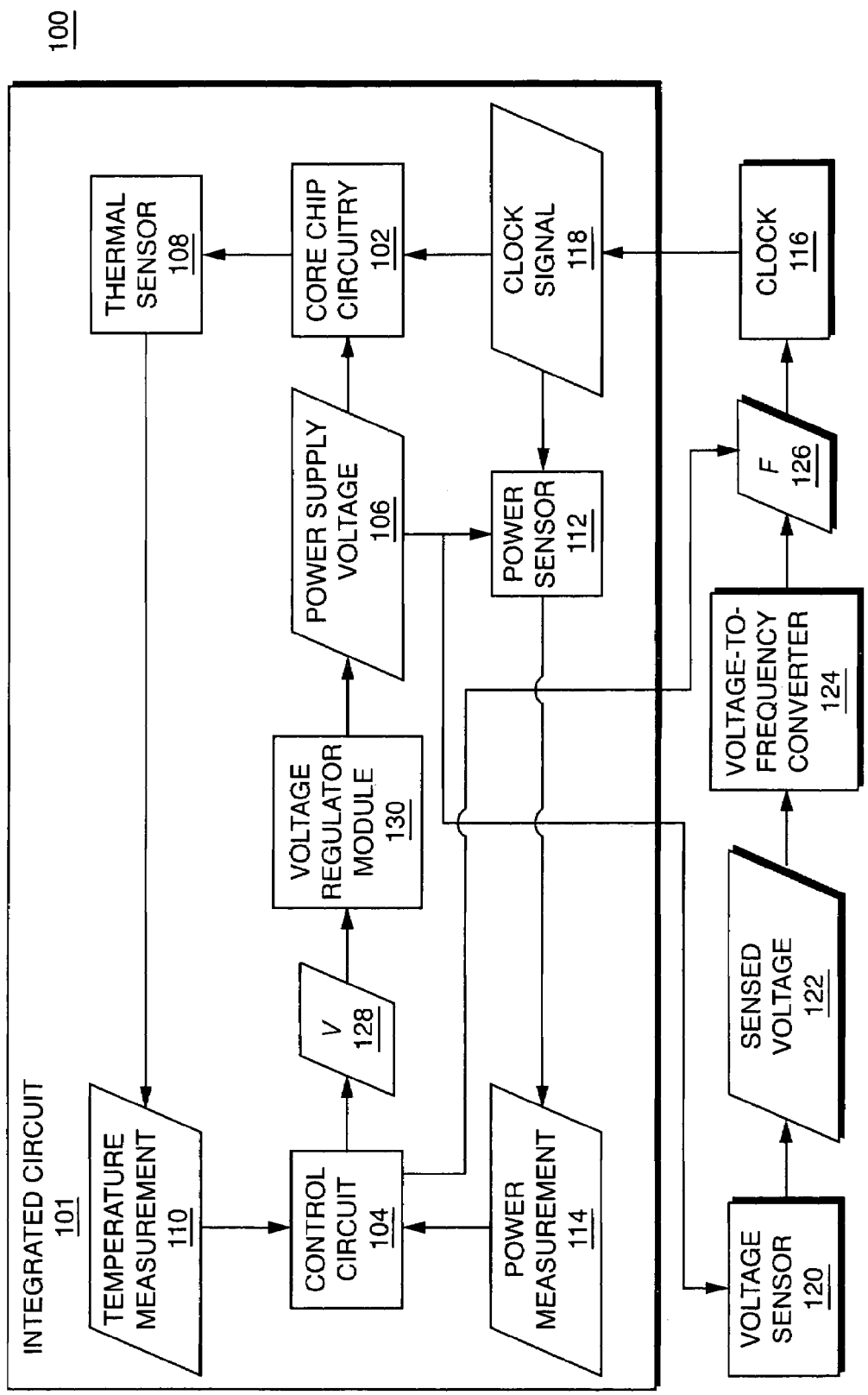
FIG. 1 is a block diagram of a system for reducing the frequency of soft errors in an integrated circuit.

Increasing the power supply voltage provided to a microprocessor reduces circuit sensitivity to particle charge injection, and therefore tends to reduce the soft error rate (SER). Increasing the power supply voltage can, however, also increase power dissipation and silicon operating temperature, thereby reducing system operating life. The patent applications referenced above disclose techniques for modulating the power supply voltage and operating frequency of an integrated circuit to optimize performance for a given power level. In one embodiment of the present invention, such a capability is utilized to provide an integrated circuit with a "high reliability" mode in which susceptibility of the circuit to soft errors is reduced. When operating in the high reliability mode, the circuit's power supply voltage is increased (such as by setting it to a maximum rated voltage), and the circuit's operating frequency is lowered so that the power dissipated by the circuit remains at or below a predetermined power limit. The frequency may, for example, be lowered only so much as is necessary to enable the predetermined power limit to be satisfied. In this way, the increased reliability obtained by increasing the circuit's power supply voltage causes the circuit's performance to decrease only as much as necessary to satisfy the predetermined power limit.

Power dissipation by an integrated circuit typically varies in proportion to the activity level of the circuit. The integrated circuit's operating frequency may be modified dynamically in response to the circuit's activity level, as reflected by its power dissipation, to maintain the predetermined power limit. In another embodiment of the present invention, the power supply voltage of the circuit is increased without decreasing the circuit's operating frequency when the activity level of the circuit is low. As a result, increased reliability may be provided without sacrificing performance so long as the activity level of the circuit is low.

The integrated circuit may operate in either the high reliability mode of operation or a normal mode of operation, in which the operating frequency and the power supply voltage may be varied to maintain the predetermined power limit. The integrated circuit may be configured to operate in the normal mode of operation by default, and to enter the high reliability mode of operation upon detection of a predetermined condition, such as the occurrence of error-correcting code (ECC) events with greater than a predetermined threshold frequency. The integrated circuit may exit the high reliability mode when the predetermined condition no longer exists (e.g., when the frequency of ECC events drops below the predetermined threshold frequency).

Alternatively, the integrated circuit may be configured to enable a user to select whether the integrated circuit operates in normal mode or in high reliability mode. For example, it may be desirable to configure the integrated circuit to operate in high reliability mode by default in high altitudes, in which soft errors occur at a higher rate than in low altitudes.

Referring to FIG. 1, a block diagram is shown of a system 100 for reducing the frequency of soft errors in an integrated circuit 101, such as a microprocessor. Although the system 100 is illustrated in block diagram form, those having ordinary skill in the art will appreciate how to implement various components of the system 100 based on the description provided herein and the description of particular implementing circuitry disclosed in the above-referenced patent applications.

The integrated circuit 101 includes core chip circuitry 102, which may include any clocked circuitry components of integrated circuit 101, such as logic to execute instructions in a microprocessor, storage elements for information the integrated circuit 101 may utilize for performing operations, arithmetic processing, or other functions. The integrated circuit 101 includes a thermal sensor 108 which measures the temperature of the core chip circuitry 102 periodically (e.g., with a frequency on the order of $1 \times 10^{-4}$ seconds) and outputs a temperature measurement 110. The system 100 also includes a clock 116 which generates clock signal 118 that is used to clock the core chip circuitry 102.

The integrated circuit 101 also includes a control circuit 104 which outputs a signal 128 indicating the power supply voltage to be provided to the core chip circuitry 102. A voltage regulator module 130 receives the signal 128 and provides a corresponding power supply voltage 106 to the core chip circuitry 102 in response.

The control circuit 104 generates the signal 128 based on the temperature measurement 110, the clock signal 118, and a power measurement 114 generated by a power sensor 112. The power sensor 112 generates the power measurement 114 based on the power supply voltage 106 and the clock signal 118. The power sensor 112 may sample the power supply voltage 106 periodically (e.g., on the order of once every $10^{-4}$ seconds).

The system 100 also includes a voltage sensor 120 which senses the power supply voltage 106 periodically (e.g., on the order of once every $10^{-7}$ seconds) and outputs a sensed voltage signal 122 representing the sensed power supply voltage 106. The system 100 also includes a voltage-to-frequency converter 124 which receives the sensed voltage signal 122 as an input and produces a frequency signal 126 as an output. The frequency signal 126 represents the frequency of the clock signal to be produced by the clock 116. The frequency signal 126 is provided as an input to clock 116, in response to which the clock 116 produces clock signal 118 having the specified frequency.

It is well-known that the switching power consumption of an integrated circuit may be represented by Equation 1:

$$P = C * V^2 * F \qquad \text{Equation 1}$$

In Equation 1, P represents power consumption, C represents switching capacitance, V represents operating voltage, and F represents clock frequency. In view of Equation 1, it should be appreciated that switching capacitance C, voltage V, and frequency F are all factors in determining the power consumption P of a chip. If it is desired that the power consumption P not exceed a particular threshold power level $P_{max}$, any of the variables C, V, or F may be modified to ensure that product of C, $V^2$, and F does not exceed $P_{max}$.

Some microprocessors are implemented with a fixed voltage and frequency determined to prevent the chip from consuming more than a particular amount of power. Typically, in designing such prior art microprocessor chips, a designer tests the chip with software code for creating a heavy computational load on the chip in order to determine the appropriate voltage and frequency that may be implemented for the chip such that its power consumption does not exceed a particular amount when heavy computational loads are encountered by the chip. However, once implemented, such heavy computational loads may be encountered relatively seldom, with low (or no) computational load being placed on the microprocessor much of the time. Accordingly, the worst case computational loads dictate the voltage and frequency of the chip, thereby hindering performance of the chip (e.g., because of the decreased frequency required for the worst case).

The voltage-to-frequency converter 124, in contrast, enables the frequency of the clock signal 118 to be varied dynamically in response to changes in the sensed voltage 122. Examples of techniques that may be used to implement the voltage-to-frequency converter 124 are described in the above-referenced patent application entitled "System and Method for Implementing an Integrated Circuit Having a Dynamically Variable Power Limit." In general, the voltage-to-frequency converter 124 may include, for example, a voltage-controlled frequency oscillator which decreases the frequency represented by frequency signal 126 as the sensed voltage 122 increases, and vice versa. The amount by which to vary the frequency and/or voltage may, for example, be calculated in accordance with Equation 1 or using other techniques disclosed in the patent application just referenced. The voltage-to-frequency converter 124 may, for example, be implemented in firmware and programmed with any desired function relating voltage to frequency.

Said patent application also describes examples of techniques for using the control circuit 104 to modulate the supply voltage 106, and thereby to cause the voltage-to-frequency converter 124 to modulate the frequency of the clock signal 118.

Figure 2A:
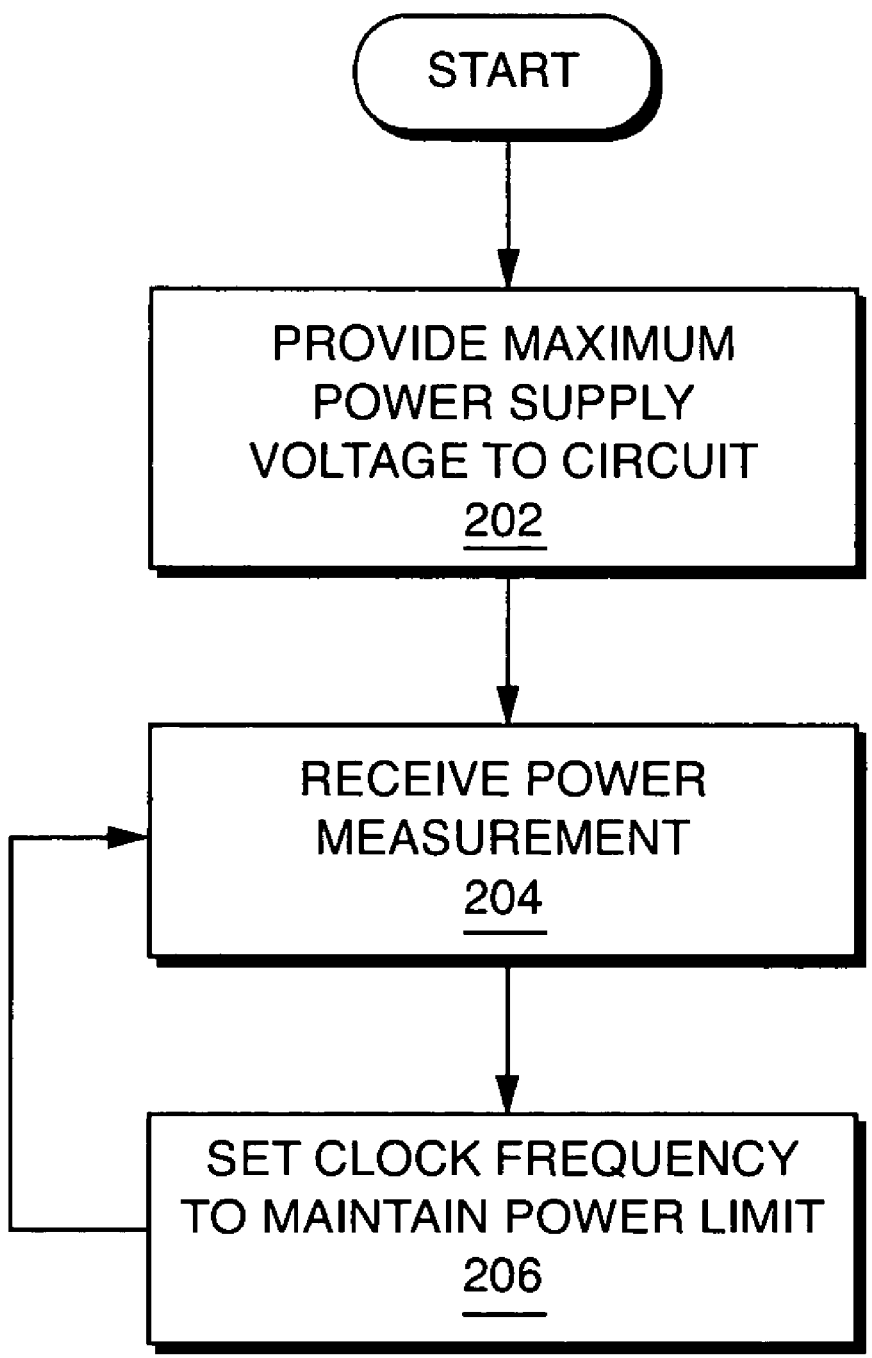
FIG. 2A is a flowchart of a method that is performed by the system of FIG. 1 when the system is operating in a high reliability mode of operation according to a first embodiment of the present invention.

Referring to FIG. 2A, a flowchart is shown of a method 200 that is performed by the system 100 when the system 100 is operating in high reliability mode according to one embodiment of the present invention. In this embodiment, the system 100 increases the power supply voltage 106 and keeps the power consumption P of the core chip circuitry 102 below a predetermined threshold level $P_{max}$ by modulating the clock frequency. F appropriately in response to the power measurement 114.

More specifically, in the example illustrated in FIG. 2A, the voltage regulator module 130 (under control of the control circuit 104) provides a predetermined maximum power supply voltage $V_{max}$ to the core chip circuitry 102 (step 202). The value of $V_{max}$ may, for example, be the maximum power supply voltage for which the integrated circuit 101 is approved by the manufacturer, or a maximum power supply voltage for which the core chip circuitry 102 has proven to operate sufficiently reliably in testing.

The control circuit 104 receives the power measurement signal 114 from the power sensor 112 (step 204). In response, the control circuit 104 generates frequency signal 126 representing a clock frequency F 126 such that $C*V^2*F$ is not greater than $P_{max}$. It should be appreciated from Equation 1 that such a value for F may be obtained using Equation 2:

$$F < \frac{P_{max}}{CV^2} \qquad \text{Equation 2}$$

The clock 116 generates clock signal 118 with a frequency equal to the frequency F specified by the voltage-to-frequency converter 124 (step 206). As a result, the power dissipated by the core chip circuitry 102 remains below the predetermined power threshold $P_{max}$. In summary, increasing the power supply voltage in step 202 causes a corresponding decrease in clock frequency in step 206.

Note that in the example just described, the control circuit 104 overrides the frequency signal generated by the voltage-to-frequency converter 124. This is merely one example of a way in which the clock 116 may be controlled to generate a clock signal having an appropriate frequency. Alternatively, for example, the control circuit 104 may override the sensed voltage 122 generated by the voltage sensor 120, thereby causing the voltage-to-frequency converter 124 to generate the frequency signal 126 in accordance with Equation 2.

Note that steps 204-206 may be repeated while the system 100 operates in high reliability mode. As a result, the clock frequency F may be adjusted in response to variations in the power consumption of the core chip circuitry 102. In particular, the clock frequency F may decrease as the activity level of the core chip circuitry 102 increases, and increase as the activity level of the core chip circuitry 102 decreases. Therefore, the system 100 provides a high degree of reliability while in high reliability mode regardless of the activity level, while decreasing performance only for as much and as long as necessitated by increased power consumption.

Although in the example illustrated in FIG. 2A the clock frequency is modulated while the system 100 is operating in high reliability mode, this is not a requirement of the present invention. For example, referring to FIG. 2B, a flowchart is shown of a method 210 that is performed by the system 100 when the system 100 is operating in high reliability mode according to another embodiment of the present invention. In this embodiment, the clock frequency F is only reduced in high reliability mode if the activity level of the system 100 is greater than a predetermined activity threshold. Otherwise, the pre-existing clock frequency is maintained. As a result, the system 100 may be provided with increased reliability without a reduction in performance when the activity level of the system 100 is low.

Figure 2B:
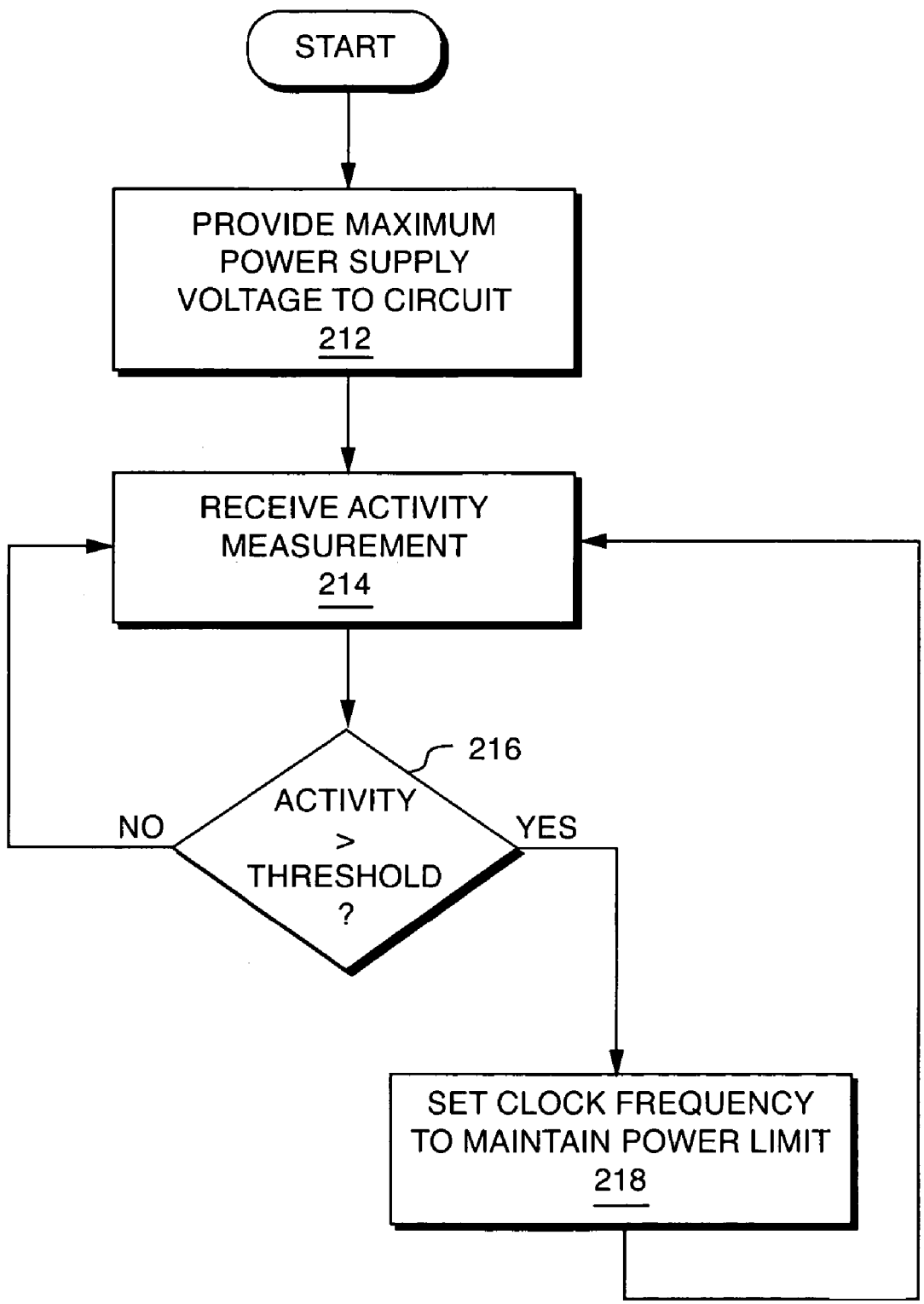
FIG. 2B is a flowchart of a method that is performed by the system of FIG. 1 when the system is operating in a high reliability mode of operation according to a second embodiment of the present invention.

More specifically, in the example illustrated in FIG. 2B, the voltage regulator module 130 (under control of the control circuit 104) provides a predetermined maximum power supply voltage $V_{max}$ to the core chip circuitry 102 (step 212), as described above with respect to step 202 in FIG. 2A. The control circuit 104 receives the power measurement 114, which may be interpreted as a measurement of the activity level of the core chip circuitry 102 (step 214). The controller 104 determines whether the current activity level is greater than a predetermined minimum activity level threshold $P_{min}$ (step 216). If the activity level is not greater than the predetermined activity level threshold $P_{min}$, the frequency of the clock signal 118 remains unchanged. The frequency of the clock signal 118 may, for example, remain at the clock frequency established in normal mode to optimize system performance (see FIG. 2C, step 228, below).

If the activity level is greater than the predetermined activity level threshold $P_{min}$, the voltage-to-frequency converter 124 sets the frequency of the clock signal 118 to maintain the predetermined power limit $P_{max}$, as described above with respect to step 206 of FIG. 2A. As a result, the increased reliability provided by increasing the power supply voltage 106 to the maximum value $V_{max}$ only results in a performance penalty if the activity level of the system 100 exceeds the activity level threshold $P_{min}$. By repeating steps 214-218, the clock frequency F may be adjusted dynamically in response to changes in activity level, thereby providing optimal performance with maximum reliability.

Figure 2C:
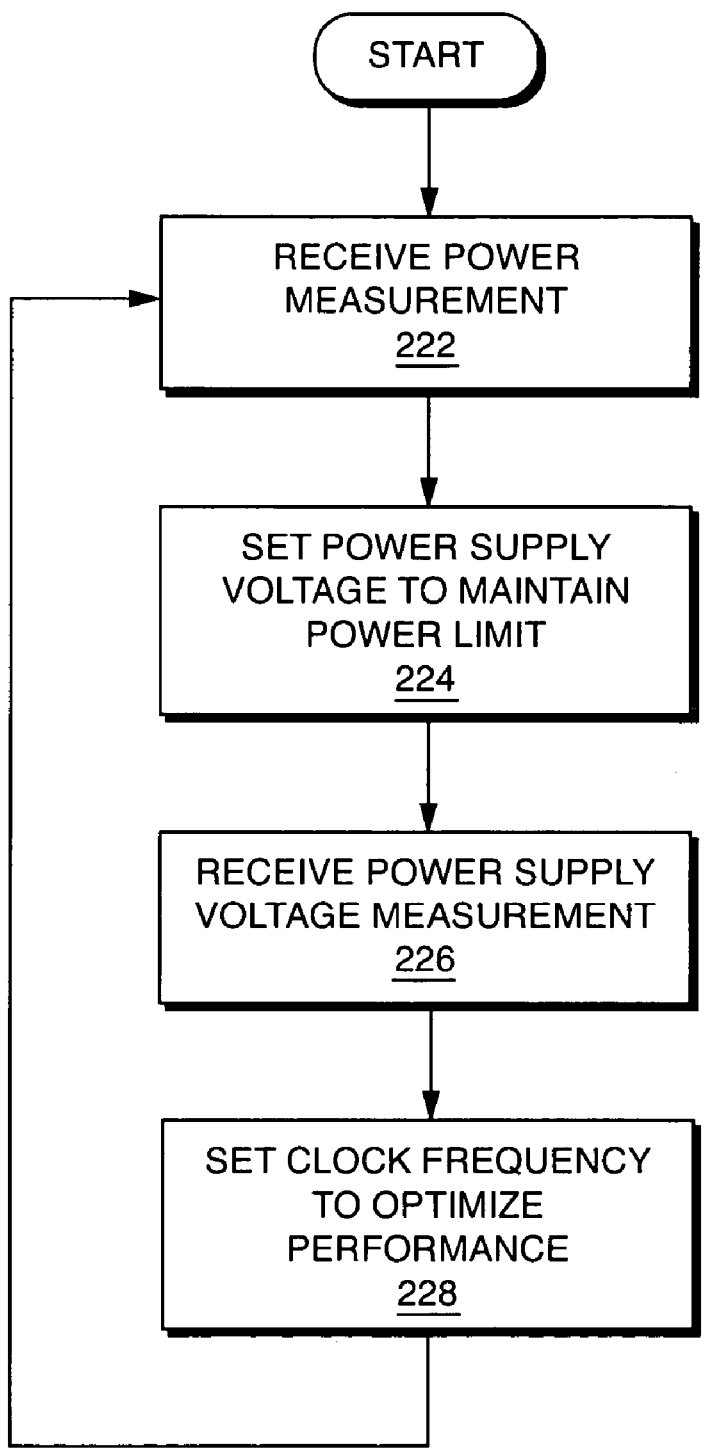
FIG. 2C is a flowchart of a method that is performed by the system of FIG. 1 when the system is operating in a normal mode of operation according to one embodiment of the present invention.

The system 100 may operate in a non-high reliability mode of operation, also referred to herein as a "normal" mode of operation. Referring to FIG. 2C, a flowchart is shown of a method 220 that is performed by the system 100 when the system 100 is operating in a normal mode of operation according to one embodiment of the present invention. In this embodiment, the system 100 keeps the power consumption P of the core chip circuitry 102 below the predetermined threshold level $P_{max}$ by modulating the power supply voltage 106 appropriately in response to the power measurement 114.

In particular, control circuit 104 receives the power measurement 114 (step 222) and sets the power supply voltage 106 (using signal 128) to maintain the predetermined power limit $P_{max}$ (step 224). For example, the control circuit 104 may set the power supply voltage 106 to a voltage V such that $C*V^2*F$ is not greater than $P_{max}$. It should be appreciated from Equation 1 that such a value for V may be obtained using Equation 3:

$$V < \sqrt{\frac{P_{max}}{CF}}$$ Equation 3

The voltage-to-frequency converter 124 receives the sensed voltage 122 (step 226) and sets the frequency of the clock signal 118 (using signal 126) to optimize performance (step 228). Note that steps 224-226 may be repeated while the system 100 operates in normal mode. As a result, the power supply voltage V and the clock frequency F may be adjusted dynamically in response to variations in the power consumption of the core chip circuitry 102.

Although not shown in FIG. 2C, the control circuit 104 may also monitor the temperature measurement 110 to determine whether the die temperature exceeds a specified threshold limit. Conditions which may cause the temperature to exceed the limit include, for example, a fan failure, removal of or damage to a heat sink, or airflow blockage. If the temperature measurement 110 exceeds the threshold limit, the power supply voltage 106 and/or the clock frequency 126 may be lowered to reduce power consumption, thereby lowering the die temperature. If such actions fail to bring the die temperature below the threshold limit, additional steps may be taken, such as disabling portions of the integrated circuit 101 or shutting down the integrated circuit 101. Such techniques may be used in normal mode, high reliability mode, or both.

Note that although a particular example of a normal (non-high reliability) mode of operation has been described with respect to FIG. 2C, the term "non-high reliability mode" may refer to any mode of operation other than the high reliability mode of operation. For example, various techniques for modifying the frequency and/or power supply voltage of an integrated circuit to provide optimum performance while maintaining a specified power limit are described in the above-referenced patent application entitled "System and Method for Implementing an Integrated Circuit Having a Dynamically Variable Power Limit."

Figure 2D:
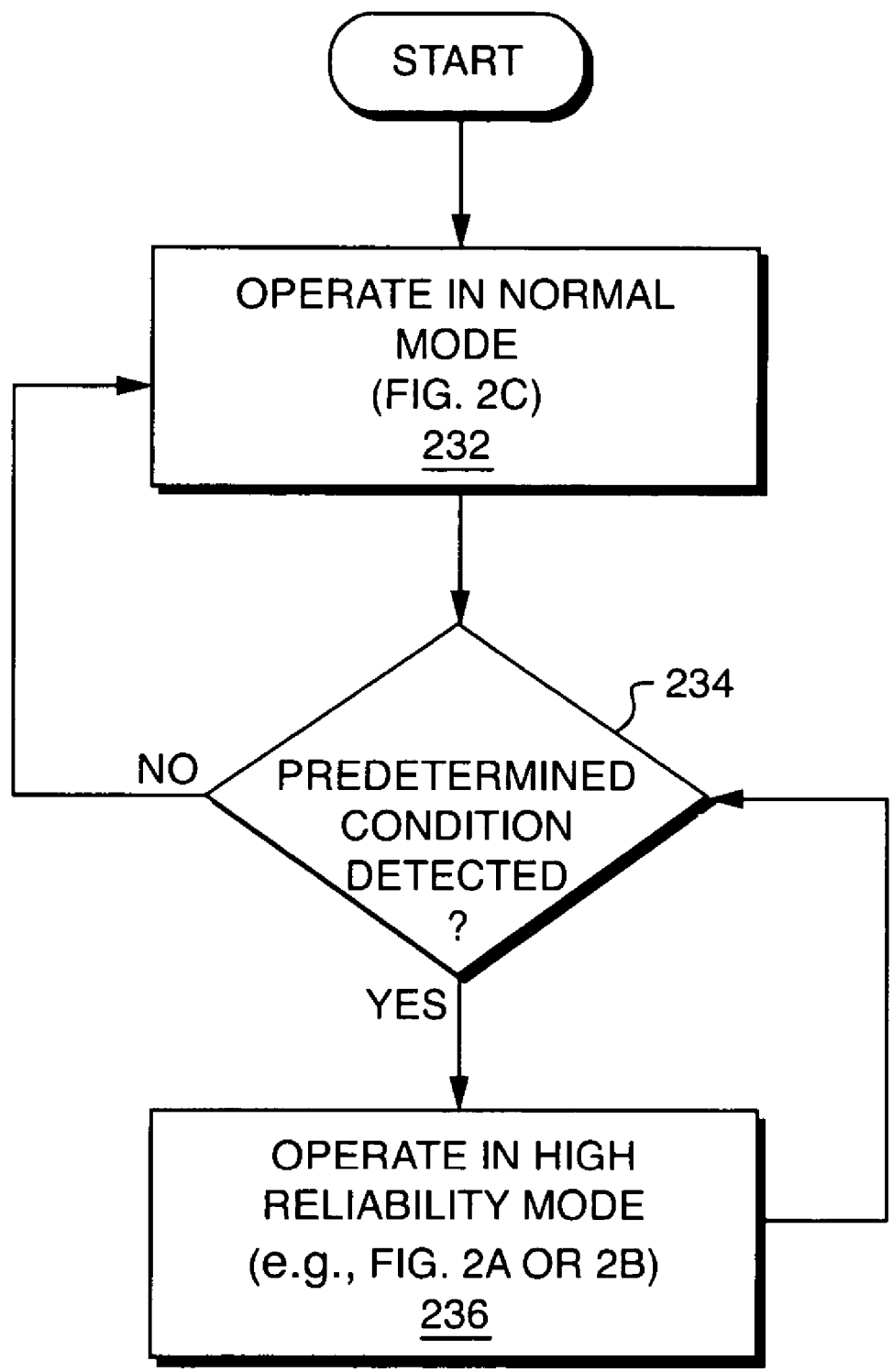
FIG. 2D is a flowchart of a method that is performed by the system of FIG. 1 to selectively operate in either a high reliability mode or a normal mode of operation according to a first embodiment of the present invention.

Referring to FIG. 2D, a flowchart is shown of a method 230 that is performed in one embodiment of the present invention in which the system 100 operates in a normal mode of operation by default, and in which the system 100 operates in high-reliability mode when a predetermined condition is detected. Assume, for example, that upon system startup the system 100 operates in normal mode (step 232), such as in the manner described above with respect to FIG. 2C.

The method 230 determines whether a predetermined condition exists (step 234). If the predetermined condition does not exist, the system 100 continues to operate in normal mode (step 232), such as in the manner described above with respect to FIG. 2C.

Such a predetermined condition may, for example, be the occurrence of error-correcting code (ECC) events in an on-chip cache (not shown) with greater than a predetermined minimum frequency. The occurrence of an ECC event indicates that a data error has been detected in the cache. Techniques for detecting ECC events are well-known to those of ordinary skill in the art. Because caches can become collectors for cosmic radiation, ECC events may be caused by soft errors induced by such radiation. Although techniques exist for correcting such errors once they have occurred, it is desirable to prevent such errors from occurring. Therefore, in the example illustrated in FIG. 2D, if the predetermined condition exists (such as the occurrence of ECC events with a high frequency), the system 100 operates in high reliability mode (step 236), such as in the manner described above with respect to FIG. 2A or 2B.

Predetermined conditions other than the occurrence of ECC events with greater than a predetermined minimum frequency may be detected in step 234. For example, decreased barometric pressure may increase the susceptibility of the integrated circuit 101 to soft errors. Barometric pressure, therefore, may be sensed, and high reliability mode may be entered if the sensed barometric pressure drops below a predetermined threshold limit. Alternatively, if the integrated circuit 101 is in an airborne or otherwise mobile system, the current location of the system 100 may be sensed (such as by using a Global Positioning System (GPS) receiver), and high reliability mode may be entered if the system 100 enters a region in which high amounts of cosmic radiation are known to exist. As yet another example, the occurrence of a radiation shower may be detected or predicted, such as by using satellite or ground sensing equipment which may, for example, detect the occurrence of a solar flare. The system 100 may enter high reliability mode in response to detection of such an event.

Another example of a predetermined condition which may trigger high reliability mode is the detection of noise or droop in the power supply voltage (not shown) delivered to the integrated circuit. Such noise or droop may cause soft errors to occur in the integrated circuit 101. The control circuit 104 may detect noise or a droop that exceeds a predetermined threshold and enter high reliability mode in response, thereby decreasing the susceptibility of the integrated circuit to soft errors.

Operating the system 100 in high reliability mode may reduce the frequency of soft errors which may otherwise occur as a result of the predetermined condition. When the predetermined condition no longer exists (step 234), the system may return to operating in normal mode (step 232).

Although in the examples illustrated in FIGS. 2A-2B, a maximum power supply voltage is provided to the core chip circuitry 102, this is not a requirement of the present invention. Rather, the power supply voltage 106 may merely be increased from its normal level to a higher level while in high-reliability mode (e.g., in step 202 of FIG. 2A or step 212 of FIG. 2B). For example, in the method 230 illustrated in FIG. 2D, the power supply voltage 106 may be increased by just enough to eliminate the predetermined condition (e.g., by decreasing the ECC error rate below the predetermined threshold). The integrated circuit 101 may, for example, continue to operate in this increased-voltage condition for a predetermined period of time or until the predetermined condition no longer exists. One advantage of increasing the power supply voltage 106 to a level below the maximum level is that it may not be necessary to provide the maximum supply voltage to eliminate the predetermined condition. As a result, providing an increased, but not maximum, power supply voltage may provide increased reliability with a minimum impact on system life.

Figure 2E:
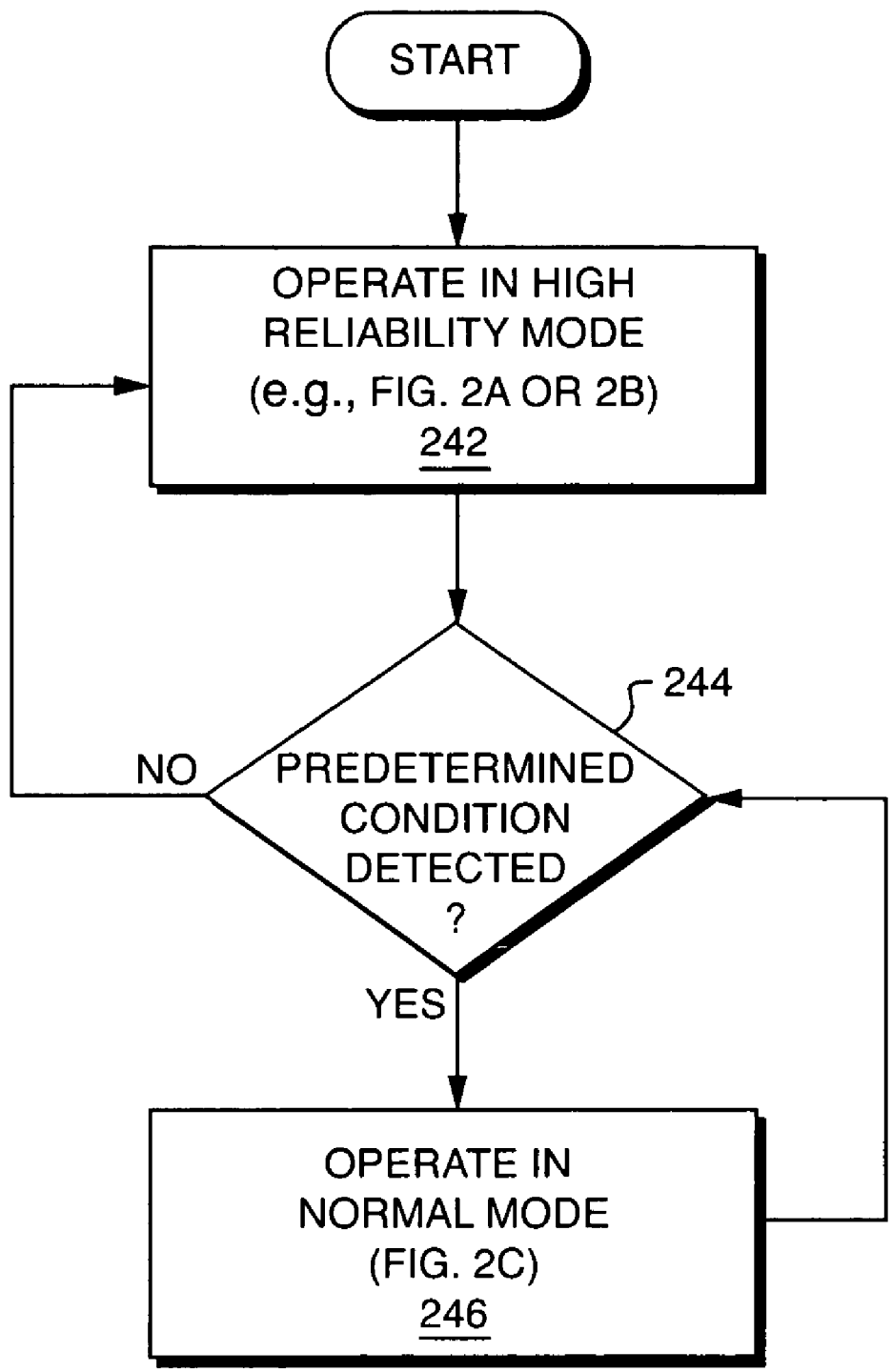
FIG. 2E is a flowchart of a method that is performed by the system of FIG. 1 to selectively operate in either a high reliability mode or a normal mode of operation according to a second embodiment of the present invention.

Referring to FIG. 2E, a flowchart is shown of a method 240 that is performed in one embodiment of the present invention in which the system 100 operates in high reliability mode by default, and in which the system 100 operates in normal mode when a predetermined condition is detected. Assume, for example, that upon system startup the system 100 operates in high reliability mode (step 242), such as in the manner described above with respect to FIG. 2A or 2B.

The method 240 determines whether a predetermined condition exists (step 244), such as in the manner described above with respect to step 234 in FIG. 2D. If the predetermined condition does not exist, the system 100 continues to operate in high reliability mode (step 242). If the predetermined condition does exist, the system 100 enters normal mode (step 246), such as in the manner described above with respect to FIG. 2C. When the predetermined condition no longer exists (step 244), the system may return to operating in high reliability mode (step 242).

The predetermined condition which is tested in step 244 may, for example, be the inverse of any of the conditions described above with respect to step 234 in FIG. 2D. For example, in the method 240 illustrated in FIG. 2E, the system 100 may operate in high reliability mode by default and enter normal mode when sensed barometric pressure rises above a predetermined threshold level or when sensed cosmic radiation decreased below a predetermined threshold level. It may be advantageous to use the method 240, in which the system 100 operates in high reliability mode by default, in situations in which high reliability is particularly critical, and in which it is determined that high reliability should only be sacrificed upon the detection of a condition which clearly indicates that soft errors are unlikely to occur.

Among the advantages of the invention are one or more of the following. Providing a fixed, maximum power supply voltage to the core chip circuitry 102 in high reliability mode provides increased reliability (i.e., decreased soft error rate). Such increased reliability need not uniformly affect performance, however, because the clock frequency may be kept high when the activity level of the circuitry 102 is low. Therefore, the techniques disclosed herein enable a high degree of reliability to be obtained without the significant decrease in performance typically associated with previous techniques. In particular, a performance penalty may be incurred only when and to the extent necessary to maintain the predetermined power limit, thereby minimizing the impact of increased reliability on average performance. The decrease in performance may, for example, be significantly lower than the 50% decrease typically associated with lockstepped systems, particularly if the activity level of the core chip circuitry 102 is relatively low.

Furthermore, the techniques disclosed herein may be implemented more easily, inexpensively, and in a smaller area than lockstep-based techniques which require redundant processors and other circuitry. In particular, the techniques disclosed herein may be implemented without requiring additional silicon area in systems which already include the hardware components illustrated in FIG. 1, in which case the techniques disclosed herein may be implemented by programming firmware components (such as the control circuit 104 and voltage-to-frequency converter 124) appropriately.

In addition, techniques disclosed herein allow power consumption and the desired degree of reliability to be traded off against each other. For example, let $V_{lo}$ be the power supply voltage provided to the core chip circuitry 102 in normal mode, and let $V_{hi}$ be the power supply voltage provided to the core chip circuitry 102 in high reliability mode. The "failures in time" (FIT) rate refers to the number of failures of an integrated circuit in $1 \times 10^9$ hours of operation. The relationship between the high and low operating voltages $V_{hi}$ and $V_{lo}$ and the FIT rate experienced at each of those voltages may be represented by Equation 4:

$$(V_{hi}^2/V_{lo}^2) \approx (\mathrm{FIT}@V_{lo})/(\mathrm{FIT}@V_{hi}) \qquad \text{Equation 4}$$

Appropriate values for $V_{hi}$ and $V_{lo}$ may be selected by identifying the FIT rates for a plurality of values of $V_{hi}$ and $V_{lo}$ and selecting values which produce optimal performance in conjunction with acceptable FIT rates. In this way, reliability and system life (which is in part a function of power consumption) may be traded off against each other to produce circuits having desired characteristics.

It is to be understood that although the invention has been described above in terms of particular embodiments, the foregoing embodiments are provided as illustrative only, and do not limit or define the scope of the invention. Various other embodiments, including but not limited to the following, are also within the scope of the claims. For example, elements and components described herein may be further divided into additional components or joined together to form fewer components for performing the same functions.

Although certain components in FIG. 1 are illustrated within the integrated circuit 101 and other components are illustrated outside of the integrated circuit 101, this division of on-chip and off-chip components is provided merely as an example and does not constitute a limitation of the present invention. Rather, components illustrated in FIG. 1 may be further integrated into the integrated circuit 101 and/or separated into additional elements.

Although the integrated circuit 101 may be a microprocessor, this is not a requirement of the present invention. Rather, the integrated circuit 101 may be any integrated circuit, such as an embedded controller, network router, graphics processor, or any other application-specific integrated circuit (ASIC).

Although particular components (such as the control circuit 104 and the voltage-to-frequency converter 124) may be described as performing particular steps of the methods illustrated in FIGS. 2A-2D, such steps may be performed by any combination of components illustrated in FIG. 1 or by other components not illustrated therein. Furthermore, although the system 100 may be described as entering and exiting high reliability mode upon the occurrence of particular conditions, such conditions are provided merely for purposes of example and do not constitute limitations of the present invention.

The techniques described above may be implemented, for example, in hardware, software, firmware, or any combination thereof. For example, the control circuit 104 and/or voltage-to-frequency converter 124 may be implemented in firmware programmed to perform the functions disclosed herein. The techniques described above may be implemented in one or more computer programs executing on a programmable computer including a processor, a storage medium readable by the processor (including, for example, volatile and nonvolatile memory and/or storage elements), at least one input device, and at least one output device. Program code may be applied to input entered using the input device to perform the functions described and to generate output. The output may be provided to one or more output devices.

What is claimed is:
1. A method comprising steps of:
   (A) identifying a power supply voltage V to provide to an integrated circuit to decrease susceptibility of the integrated circuit to soft errors;
   (B) providing the power supply voltage V to the Integrated circuit;

(C) identifying a clock frequency F for which $F<P_{max}/(CV^2)$, wherein C comprises a switching capacitance and wherein $P_{max}$ comprises a predetermined maximum power consumption of the integrated circuit; and (D) providing a clock signal having frequency F to the integrated circuit.

2. The method of claim 1, wherein the steps (C)-(D) are performed without modifying the power supply voltage V provided to the integrated circuit.

3. The method of claim 1, wherein the step (D) comprises a step of decreasing the frequency of the clock signal to the frequency F.

4. The method of claim 1, wherein the power supply voltage V comprises a maximum power supply voltage.

5. The method of claim 4, wherein the maximum power supply voltage comprises a maximum rated power supply voltage.

6. The method of claim 1, wherein the step (B) comprises a step of increasing the power supply voltage provided to the integrated circuit.

7. The method of claim 1, further comprising a step of:
(C) repeating steps (A) and (B) periodically.

8. The method of claim 1, wherein the integrated circuit comprises a microprocessor.

9. The method of claim 1, further comprising steps of:
(C) prior to step (B), determining whether a predetermined condition exists; and
(D) performing step (B) only if the predetermined condition is determined to exist.

10. The method of claim 9, wherein the predetermined condition comprises an occurrence of error-correcting code events in the integrated circuit with a frequency greater than a predetermined threshold frequency.

11. The method of claim 9, wherein step (D) comprises a step of repeating step (B) while the predetermined condition exists.

12. The method of claim 1, further comprising steps of:
(C) prior to step (B), determining whether a predetermined condition exists; and
(D) performing step (B) unless the predetermined condition is determined to exist.

13. The method of claim 12, wherein step (D) comprises a step of repeating step (B) unless the predetermined condition exists.

14. A device comprising:
a circuit;
first identification means for identifying a power supply voltage V to provide to the circuit to decrease susceptibility of the circuit to soft errors;
power supply provision means for providing the power supply voltage V to the circuit;
second identification means for identifying a clock frequency F for which $F<P_{max}/(CV^2)$, wherein C comprises a switching capacitance and wherein $P_{max}$ comprises a predetermined maximum power consumption of the circuit; and
clock signal generation means for providing a clock signal having frequency F to the circuit.

15. The device of claim 14, wherein the power supply provision means comprises means for providing a maximum power supply voltage to the circuit.

16. The device of claim 14, wherein the power supply provision means comprises means for increasing the power supply voltage provided to the circuit.

17. The device of claim 14, wherein the device comprises a microprocessor.

18. The device of claim 14, further comprising:
means for determining whether a predetermined condition exists; and
means for activating the first identification means and the power supply provision means only if the predetermined condition is determined to exist.

19. The device of claim 14, further comprising:
means for determining whether a predetermined condition exists; and
means for activating the first identification means and the power supply provision means unless the predetermined condition is determined to exist.

20. A method comprising steps of:
(A) increasing a power supply voltage provided to an integrated circuit;
(B) determining whether an activity level of the integrated circuit exceeds a predetermined minimum activity level threshold, comprising:
(B)(1) indentifying an amount of power P consumed by the intergrated circuit; and
(B)(2) determining whether p is greater than a predetermined minimum power comsumpton threshold $P_{min}$; and
(C) reducing a clock frequency of a clock signal provided to the integrated circuit only if the activity level of the integrated circuit is determined to exceed the predetermined minimum activity level.

21. The method of claim 20, wherein the step (A) comprises a step of providing a maximum power supply voltage to the integrated circuit.

22. The method of claim 21, wherein the maximum power supply voltage comprises a maximum rated power supply voltage.

23. The method of claim 20, further comprising a step of:
(D) repeating steps (B) and (C) periodically.

24. The method of claim 23, wherein the step (D) is performed without modifying the power supply voltage provided to the integrated circuit.

25. The method of claim 20, wherein the integrated circuit comprises a microprocessor.

26. A device comprising:
power supply adjustment means for increasing a power supply voltage provided to a circuit;
activity level detection means for determining whether an activity level of the circuit exceeds a predetermined minimum activity level threshold, comprising:
means for indentifying an amount of power P consumed by the intergrated circuit; and
means for determining whether p is greater than a predetermined minimum power comsumpton threshold $P_{min}$; and
clock frequency adjustment means for reducing a clock frequency of a clock signal provided to the circuit only if the activity level of the circuit is determined to exceed the predetermined minimum activity level.

27. The device of claim 26, wherein the power supply adjustment means comprises means for providing a maximum power supply voltage to the circuit.

28. The device of claim 26, wherein the device comprises a microprocessor.

29. A device comprising:
a first circuit having a power supply input;
a voltage regulator module coupled to the power supply input to provide a power supply voltage V to the first circuit;
a clock coupled to the first circuit to provide to the first circuit a clock signal having frequency F;

a power sensor coupled to the first circuit to determine whether an activity level of the first circuit exceeds a predetermined minimum activity level threshold; and a control circuit coupled to the voltage regulator module to control the voltage regulator module to increase the power supply voltage V and to control the clock to reduce the frequency F only if the activity level of the circuit is determined to exceed the predetermined minimum activity level.

30. The device of claim 29, wherein the control circuit comprises means for controlling the voltage regulator module to provide a maximum power supply voltage to the first circuit.

31. The device of claim 29, wherein the device comprises a microprocessor.

* * * * *

UNITED STATES PATENT AND TRADEMARK OFFICE
CERTIFICATE OF CORRECTION

PATENT NO. : 7,447,919 B2  Page 1 of 1
APPLICATION NO. : 10/818974
DATED : November 4, 2008
INVENTOR(S) : Steven F. Liepe et al.

It is certified that error appears in the above-identified patent and that said Letters Patent is hereby corrected as shown below:

In column 10, line 66, in Claim 1, delete "Integrated" and insert -- integrated --, therefor.

In column 12, line 19, in Claim 20, delete "indentifying" and insert -- identifying --, therefor.

In column 12, line 20, in Claim 20, delete "intergrated" and insert -- integrated --, therefor.

In column 12, line 21, in Claim 20, delete "p" and insert -- P --, therefor.

In column 12, line 22, in Claim 20, delete "comsumpton" and insert -- consumption --, therefor.

In column 12, line 47, in Claim 26, delete "indentifying" and insert -- identifying --, therefor.

In column 12, line 48, in Claim 26, delete "intergrated" and insert -- integrated --, therefor.

In column 12, line 49, in Claim 26, delete "p" and insert -- P --, therefor.

In column 12, line 50, in Claim 26, delete "comsumpton" and insert -- consumption --, therefor.

Signed and Sealed this

Second Day of June, 2009

JOHN DOLL
*Acting Director of the United States Patent and Trademark Office*